United States Patent
Li

(10) Patent No.: US 7,053,683 B2
(45) Date of Patent: May 30, 2006

(54) VOLTAGE CONTROLLED OSCILLATOR WITH AUTOMATIC BAND SELECTOR

(75) Inventor: Dandan Li, San Diego, CA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/855,459

(22) Filed: May 27, 2004

(65) Prior Publication Data
US 2005/0264330 A1   Dec. 1, 2005

(51) Int. Cl.
   *H03L 7/06* (2006.01)
(52) U.S. Cl. .................. 327/156; 327/147
(58) Field of Classification Search ............ None
   See application file for complete search history.

(56) References Cited

U.S. PATENT DOCUMENTS

| | | | |
|---|---|---|---|
| 4,590,602 A * | 5/1986 | Wolaver ............ | 375/375 |
| 5,923,196 A * | 7/1999 | Okamoto ........... | 327/156 |
| 6,112,068 A * | 8/2000 | Smith et al. ....... | 455/260 |
| 6,411,660 B1 * | 6/2002 | Oh .................... | 375/327 |
| 6,583,675 B1 * | 6/2003 | Gomez .............. | 331/17 |
| 6,711,229 B1 * | 3/2004 | Harada .............. | 375/376 |
| 2003/0224749 A1 * | 12/2003 | Uozumi et al. .... | 455/252.1 |

* cited by examiner

Primary Examiner—Timothy P. Callahan
Assistant Examiner—Cassandra Cox

(57) ABSTRACT

A method and circuit for selecting the band of a multi-band voltage controlled oscillator in a phase locked loop is described. In one implementation, the circuit comprises a voltage controlled oscillator, a selection circuit for selecting a band for the voltage controlled oscillator from a plurality of predetermined bands, a decision circuit for determining if the selection circuit should select a new band from the plurality of predetermined bands, and a charging circuit for adjusting the input voltage into the voltage controlled oscillator.

19 Claims, 7 Drawing Sheets

$$OUT = C_1 \cdot D_2 + C_2 \cdot D_3 + (\overline{C_1 + C_2}) \cdot D_1$$

VOLTAGE CONTROLLED OSCILLATOR WITH AUTOMATIC BAND SELECTOR

TECHNICAL FIELD

The present invention relates generally to voltage controlled oscillators, and, more specifically, to a voltage controlled oscillator with automatically selected multiple tuning bands for use in a phase-locked loop.

BACKGROUND

Frequency synthesizers are commonly used in wireless devices to generate sinusoidal output signals. A commonly used frequency synthesizer configuration is that of a phase-locked loop. Phase locked loop frequency synthesizers, for instance, are used to provide a local oscillator frequency within the wireless device.

A phase locked loop frequency synthesizer in accordance with the prior art is shown in FIG. 1. Phase locked loop frequency synthesizers generally contain a voltage-controlled oscillator (VCO) 101 combined with a phase detector 103. A signal of a given frequency ($f_{REF}$) is applied to the phase detector 103. The output of the phase detector 103 is a voltage/current proportional to the phase difference between the input $f_{REF}$ and a second input coupled to the output of the VCO 101 through a divide by N frequency divider 105. The output of the phase detector 103 is provided to a loop filter 107, with the output from the loop filter 107 providing the input to the voltage controlled oscillator 101. A local oscillator frequency output 109 is provided from the voltage controlled oscillator 101. This output also provides the input to the divide by N frequency divider, thus completing the phase locked loop.

For devices that operate in the GHz range, an LC type of voltage controlled oscillator is commonly used. LC voltage controlled oscillators comprise a series of inductors and varactors that form an LC tank circuit. An example of a typical LC type voltage controlled oscillator is shown in FIG. 2. A pair of inductors 201, 202 and a pair of varactors 203, 204 are used in conjunction with a pair of transistors 207, 208 to build the LC voltage controlled oscillator. Positive feedback is created using the transistors 207, 208 to sustain the oscillation output.

The output oscillation frequency from the voltage controlled oscillator is varied by varying the input DC voltage $V_c$ 210 across the varactors 203, 204. $V_c$ is limited by the selected supply voltage, and thus the output frequency range of the voltage controlled oscillator is also limited by $V_c$. In many wireless applications, a wide frequency tuning range is desired to allow for multiple channels. Wide tuning range oscillators, however, require steep tuning curves, and this tends to create undesirable phase noise. In order to allow for a wide frequency tuning range without causing undesirable levels of phase noise, multi-band voltage controlled oscillators are used.

A multi-band voltage controlled oscillator adds a series of switching capacitors to the circuit shown in FIG. 2 in order to improve the output frequency range. Each switching capacitor can provide extra capacitance to the voltage controlled oscillator, thus increasing the output frequency tuning range of the oscillator.

FIG. 3A illustrates a multi-band voltage controlled oscillator. A series of switching capacitors 301, 302, 303, 304, 305, 306 can be connected to the voltage controlled oscillator by setting digital control voltages $V_{K1}$, $V_{K2}$, and $V_{K3}$. Using the switching capacitors to select one of several bands allows a wide frequency tuning range, while avoiding an increase in phase noise that would occur in a single band oscillator with a steep tuning curve.

The tuning curves for a multi-band voltage controlled oscillator as shown in FIG. 3A are depicted in FIG. 3B. For each band, the frequency increases as $V_c$ increases. An optimum usable range of tuning voltages is shown between $V_L$ and $V_H$. When $V_c$ exceeds $V_H$ (or when $V_c$ is less than $V_L$), the multi-band voltage controlled oscillator needs to change from one band to the next. When the tuning voltage exceeds the high-end limit, $V_H$, for a particular band (typically determined by comparing the tuning voltage with a reference voltage equal to the high-end limit), one or more of the switching capacitors is switched off to jump the voltage controlled oscillator to the next higher band. Once the new band is selected, a waiting period is required to allow the phase locked loop to settle. If, after settling, the input voltage $V_c$ remains outside of the predetermined limits, the process is repeated to select another band.

If a second input voltage comparison is undertaken before the minimum settling period for a particular phase-locked loop has expired, it can cause the phase-locked loop circuit to become unstable. Additionally, because the settling period varies depending on the characteristics of the phase-locked loop, the proper waiting time must be calculated for each individual phase-locked loop circuit configuration. This delay after band switching while the tuning voltage settles before a subsequent determination of whether the tuning voltage is within the predetermined voltage limits can be made is one disadvantage of prior art phase-locked loop circuits comprising multi-band voltage controlled oscillators.

The amount of delay required depends upon the individual dynamics of the phase-locked loop circuit. If a second input voltage comparison is undertaken before the minimum settling period for a particular phase-locked loop has expired, it can cause the phase-locked loop circuit to become unstable. Additionally, because the settling period varies depending on the characteristics of the phase-locked loop, the proper waiting time must be calculated for each individual phase-locked loop circuit configuration.

It is desirable to have a phase-locked loop circuit comprising a multi-band voltage controlled oscillator that is capable of automatic band selection without requiring a pre-calculated delay or settling period following band switching which is based on individual phase locked loop characteristics.

SUMMARY

The present invention provides a method and circuit for selecting the band of a multi-band voltage controlled oscillator in a phase locked loop. In an exemplary implementation, the circuit comprises a voltage controlled oscillator, a selection circuit for selecting a band for the voltage controlled oscillator from a plurality of predetermined bands, a decision circuit for determining if the selection circuit should select a new band from the plurality of predetermined bands, and a charging circuit for adjusting the input voltage into the voltage controlled oscillator.

The method and circuit in accordance with the present invention resets the tuning voltage to the voltage controlled oscillator upon selecting a band from the plurality of pre-determined bands. By automatically resetting the tuning voltage to a desired level, no pre-calculated settling delay period is required.

In an exemplary implementation, the method for automatic band selection in a phase locked loop in accordance with the present invention comprises the steps of 1) measuring an input voltage to the voltage controlled oscillator; 2) determining if said input voltage is outside of predetermined voltage levels; 3) selecting a different band from said plurality of bands; and 4) resetting said input voltage.

BRIEF DESCRIPTION OF THE DRAWINGS

The detailed description is described with reference to the accompanying figures. In the figures, the left-most digit(s) of a reference number identifies the figure in which the reference number first appears.

DETAILED DESCRIPTION

Figure 1:
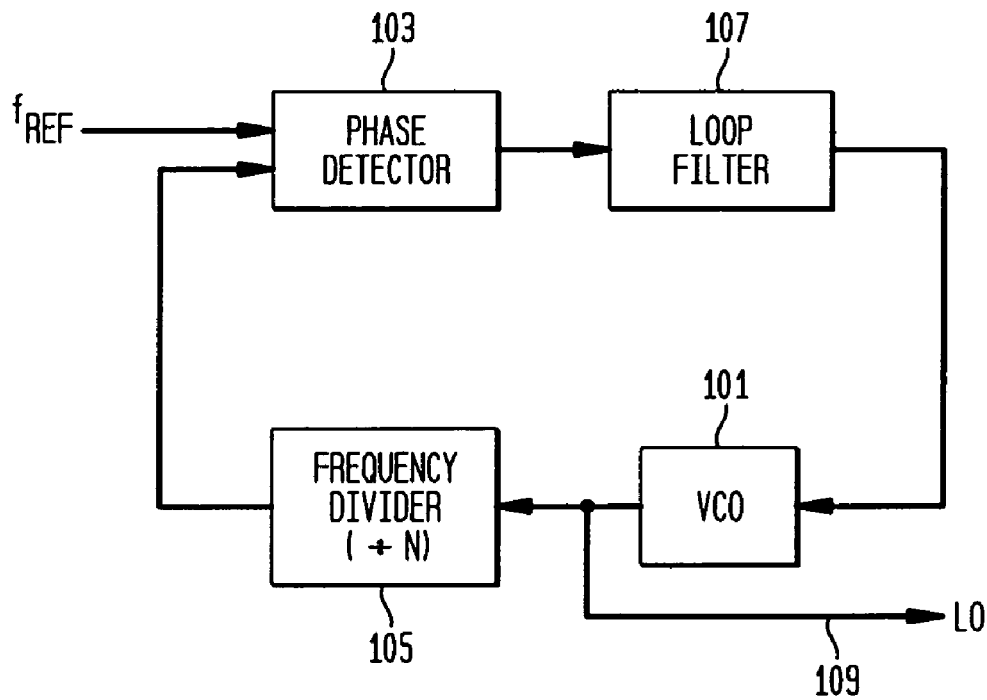
FIG. 1 is a diagram of a phase-locked loop circuit in accordance with the prior art.
Figure 2:
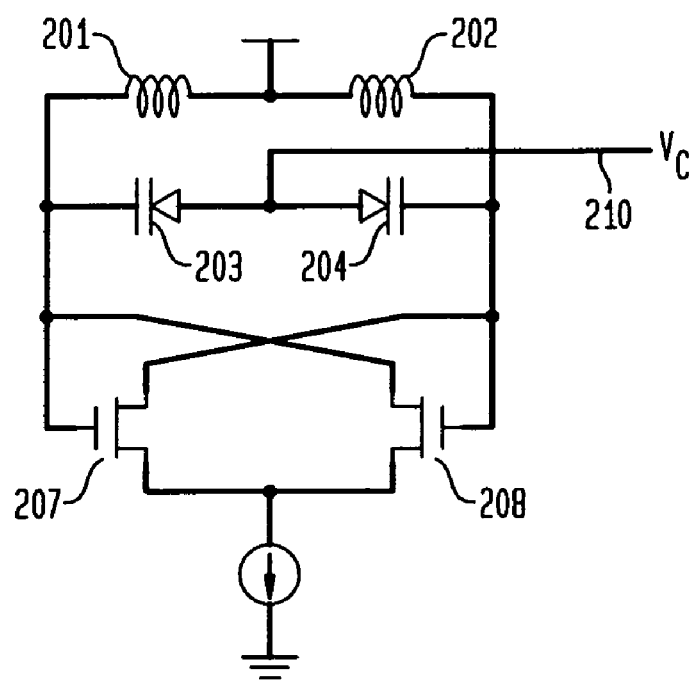
FIG. 2 is a circuit diagram of a voltage controlled oscillator in accordance with the prior art.
Figure 3A:
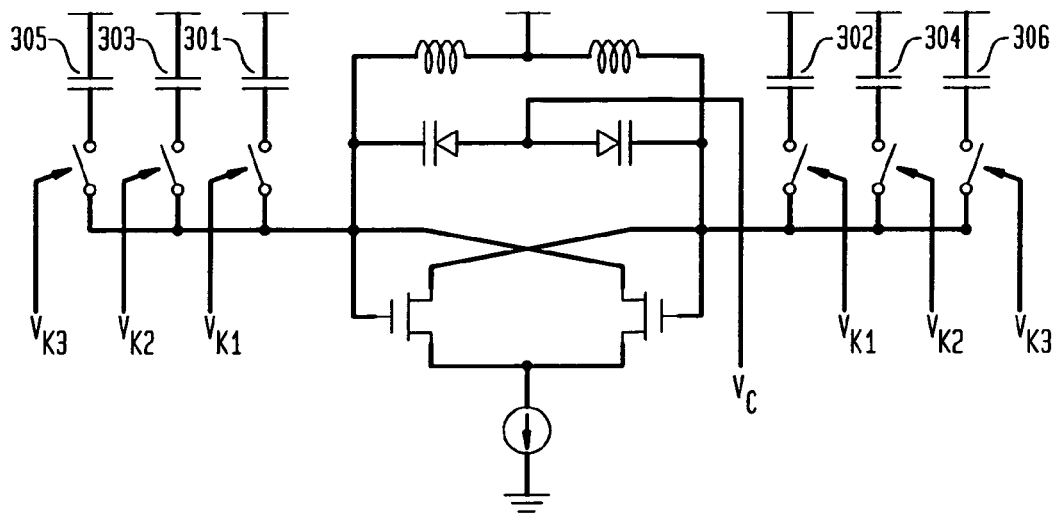
FIG. 3A is a circuit diagram of a multi-band voltage controlled oscillator in accordance with the prior art.
Figure 3B:
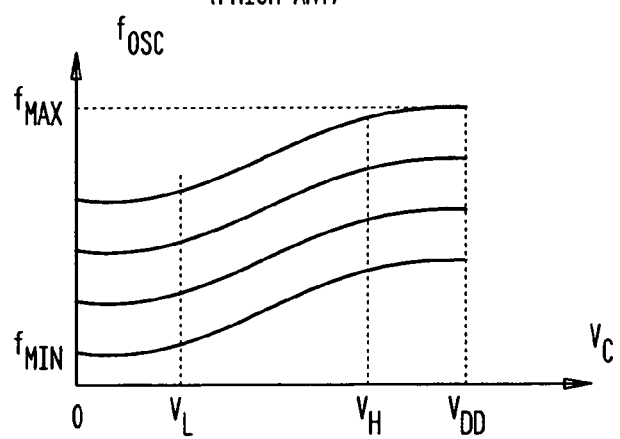
FIG. 3B is a graph of the tuning curves of the voltage controlled oscillator of FIG. 3A.
Figure 4:
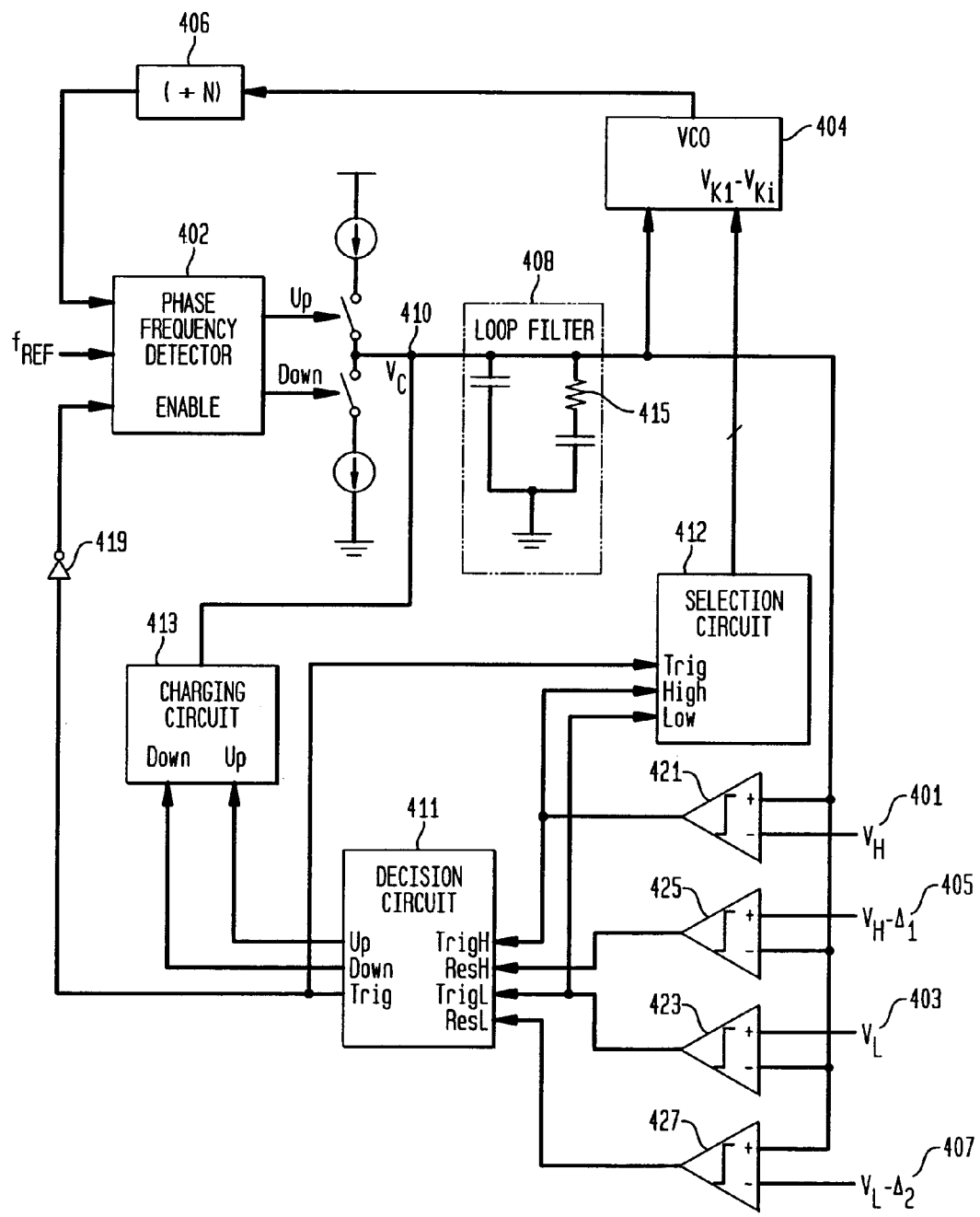
FIG. 4 is a diagram of a phase-locked loop with automatic voltage controlled oscillator band selection in accordance with the present invention.

Referring to FIG. 4, a diagram of a circuit in accordance with an exemplary implementation of the present invention is shown. The circuit comprises a phase locked loop having a phase frequency detector 402, a loop filter 408, a voltage controlled oscillator (VCO) 404, and a divide by N divider 406. The multi-band VCO has an input coupled to a particular input voltage $V_c$ 410.

In order to determine whether $V_c$ 410 resides within an appropriate range for the band in which the multi-band VCO is operating (i.e., whether a band change is required), a plurality of reference voltages is provided. $V_H$ 401 and $V_L$ 403 are representative of the high and low voltages for a particular band. $V_{H-\Delta 1}$ 405 and $V_{L+\Delta 2}$ 407 are reference voltages that represent the optimal usable limits within the band. The VCO input voltage $V_c$ 410 is compared to the plurality of reference voltages. An input voltage $V_c$ 410 that does not fall between $V_H$ and $V_L$ triggers the decision circuit 411 to drive the selection circuit 412 to select a different band for the multi-band VCO 404. This is accomplished by choosing a band with more or less switching capacitance.

When a new band is selected, the decision circuit 411 breaks the phase locked loop by disabling the phase frequency detector 402. This is accomplished by providing a high output from the decision circuit 411 to inverter 419 and providing the low output of inverter 419 to the enable input of phase frequency detector circuit 402.

When the phase locked loop is disabled, the charging circuit 413 is activated by the decision circuit 411. The charging circuit will actively reset VCO input voltage $V_c$ 410 such that the phase locked loop is not required to wait a predetermined settling period before determining if $V_c$ 410 resides within the proper levels for a particular band. When $V_c$ 410 is less than $V_{L+\Delta 2}$ 407, the charging circuit 413 causes the voltage level $V_c$ 410 to charge until it reaches $V_{L+\Delta 2}$ 407 (or alternatively discharge until it reaches $V_{H-\Delta 1}$ 405 when $V_c$ 410 is greater than $V_{H-\Delta 1}$ 405). The decision circuit 411 instructs the charging circuit 413 whether to charge or discharge. Once the desired level ($V_{L+\Delta 2}$ 407 or $V_{H-\Delta 1}$ 405) is reached, as determined by comparison of $V_c$ to the various reference voltages using a series of comparators 421, 423, 425, 427, the decision circuit 411 disables the charging circuit 413 and enables the phase frequency detector 402. This closes the phase locked loop and allows it to resume operation.

Once the phase locked loop is closed, the process repeats itself until $V_c$ 410 resides between $V_H$ 401 and $V_L$ 403. The selection of the delta amounts used to set $V_{H-\Delta 1}$ 405 and $V_{L+\Delta 2}$ 407 are selected to be sufficiently great to account for ripples in VCO input voltage $V_c$ 410 caused by the resistor 415 present in the loop filter 408.

Figure 5:
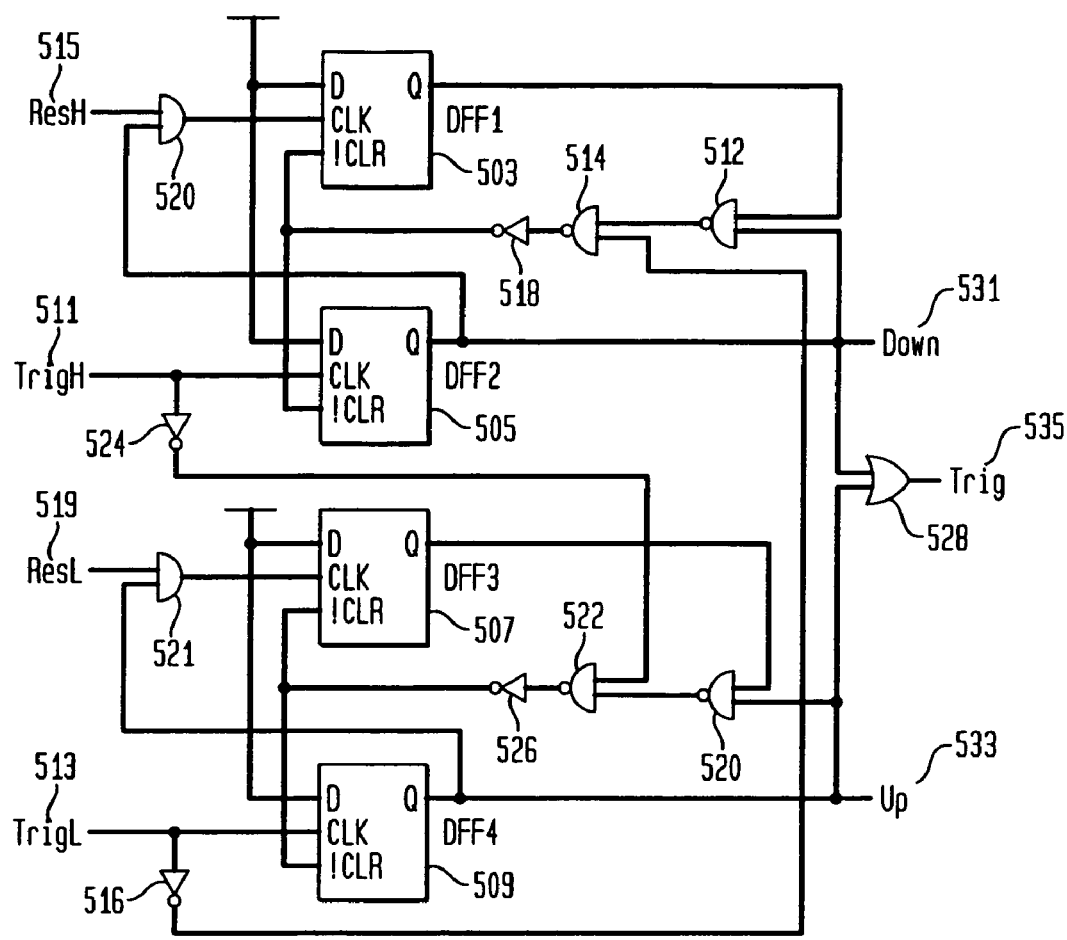
FIG. 5 is a circuit diagram of the decision circuit of a phase-locked loop with automatic voltage controlled oscillator band selection in accordance with the present invention.

A schematic circuit diagram of an exemplary implementation of the decision circuit 411 is shown in detail in FIG. 5. The circuit comprises four D type flip flops: DFF1 503, DFF2 505, DFF3 507, and DFF4 509. The flip-flops work in pairs, with DFF1 503 and DFF2 505 comprising the first pair, and DFF3 507 and DFF4 509 comprising the second pair. The Q output of DFF1 503 is coupled to NAND gate 512, with the remaining input to NAND gate 512 coupled to the Q output of DFF2 505. The output of NAND gate 512 is coupled to an input of NAND gate 514, with the remaining input of NAND gate 514 coupled to TrigL 513, through an inverter 516. The output of NAND gate 514 is inverted by inverter 518 and coupled to the clear inputs of DFF1 503 and DFF2 505. The ResH 515 input is coupled to AND gate 520, with the second input to AND gate 520 tied to the Q output of DFF2 505. The output of AND gate 520 is coupled to the clock input of DFF1 503.

The remaining two flip-flops, DFF3 507 and DFF4 509, are similarly configured. The Q output of DFF3 507 is coupled to NAND gate 520, with the remaining input to NAND gate 520 coupled to the Q output of DFF4 509. The output of NAND gate 520 is coupled to an input of NAND gate 522, with the remaining input of NAND gate 522 coupled to TrigH 511, through an inverter 524. The output of NAND gate 522 is inverted by inverter 526 and coupled to the clear inputs of DFF3 507 and DFF4 509. The ResL 519 input is coupled to AND gate 521, with the second input to AND gate 521 tied to the Q output of DFF4 509. The output of AND gate 521 is coupled to the clock input of DFF3 507.

The decision circuit provides three outputs: a DOWN output 531, and UP output 533, and a TRIG output 535. These outputs are used to drive the charging circuit (413 in FIG. 4) and the phase frequency detector (402 in FIG. 4). The high value at the DOWN output 531 instructs the charging circuit to discharge $V_c$ until it reaches $V_{H-\Delta 1}$, while a high value at the UP output 533 instructs the charging circuit to charge $V_c$ until it reaches $V_{L+\Delta 2}$. The UP output 533 and the DOWN output 531 are coupled to OR gate 528, with the output of OR gate 528 providing the TRIG output 535. This output is used to disable the phase frequency detector when either the UP output 533 or the DOWN output 531 is high. The TRIG output 535 is also used to trigger the selection circuit (412 of FIG. 4) to switch bands in the VCO.

Figure 6:
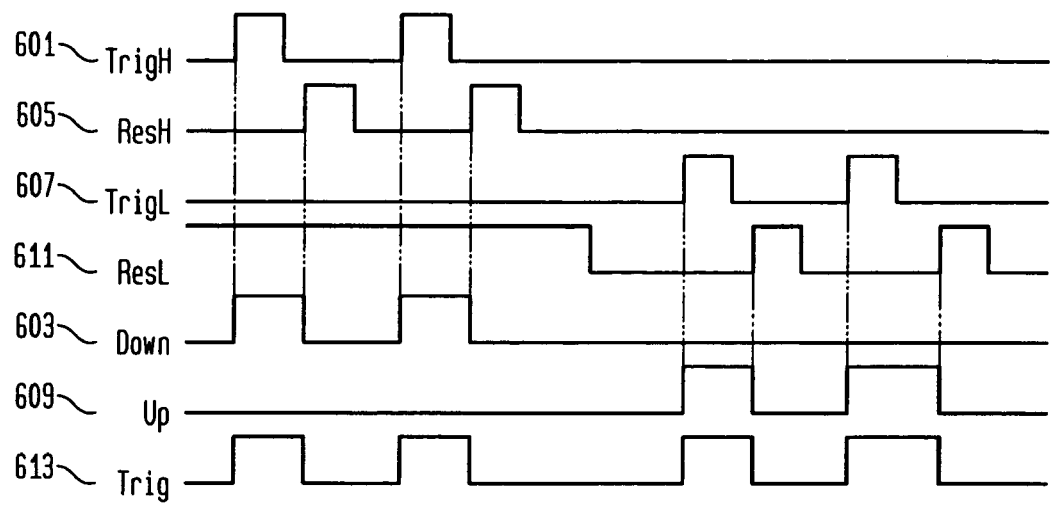
FIG. 6 is a graph of the waveforms of the circuit shown in FIG. 5.

The waveforms illustrating the behavior of the decision circuit are shown in FIG. 6. When the input voltage $V_c$ exceeds $V_H$, a high signal is received at the high trigger, TrigH 601. This results in DFF1 503 and DFF2 505 entering an active mode, while DFF3 507 and DFF4 509 enter a reset mode. A high input on TrigH waveform 601 drives the DOWN output waveform 603 high. When the input voltage $V_c$ drops below $V_{H-\Delta 1}$, the reset high input, ResH waveform 605 goes high, causing the DOWN output waveform 603 to drop from high to low.

When the input voltage $V_c$ is less than $V_L$, a high signal is received at the low trigger waveform, TrigL waveform 607. This results in DFF3 507 and DFF4 509 entering an active mode, while DFF1 503 and DFF2 505 enter a reset mode. A high input on TrigL waveform 607 drives the UP output waveform 609 high. When the input voltage $V_c$ rises above $V_{L+\Delta 2}$, the reset low input waveform, ResL 611, goes high, causing the UP output waveform 609 to drop from high to low. The Trig output waveform 613 goes high each time the UP output waveform 609 or DOWN output waveform 603 goes high.

Figure 7:
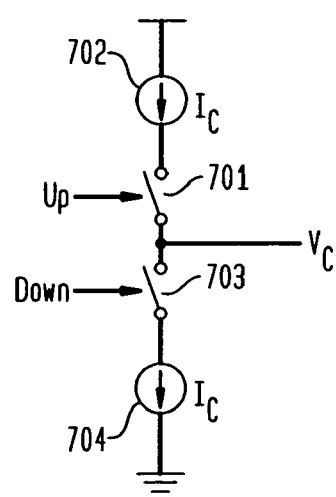
FIG. 7 is a circuit diagram of the charging circuit of a phase-locked loop with automatic voltage controlled oscillator band selection in accordance with the present invention.

A schematic circuit diagram of an exemplary implementation of the charging circuit (413 in FIG. 4) is shown in FIG. 7. The charging circuit comprises a pair of current sources 702, 704 and a pair of switches 701, 703 which act complementary to each other. A first switch 701 couples $V_c$ to a first current source 702. When first switch 701 is closed (and second switch 703 is open), current source 702 drives $V_c$ higher. A second switch 703 couples $V_c$ to a second current source 704. The second current source 704 acts as a current drain. Thus, when second switch 703 is closed (and first switch 701 is open), current source 704 drives $V_c$ lower.

Figure 8A:
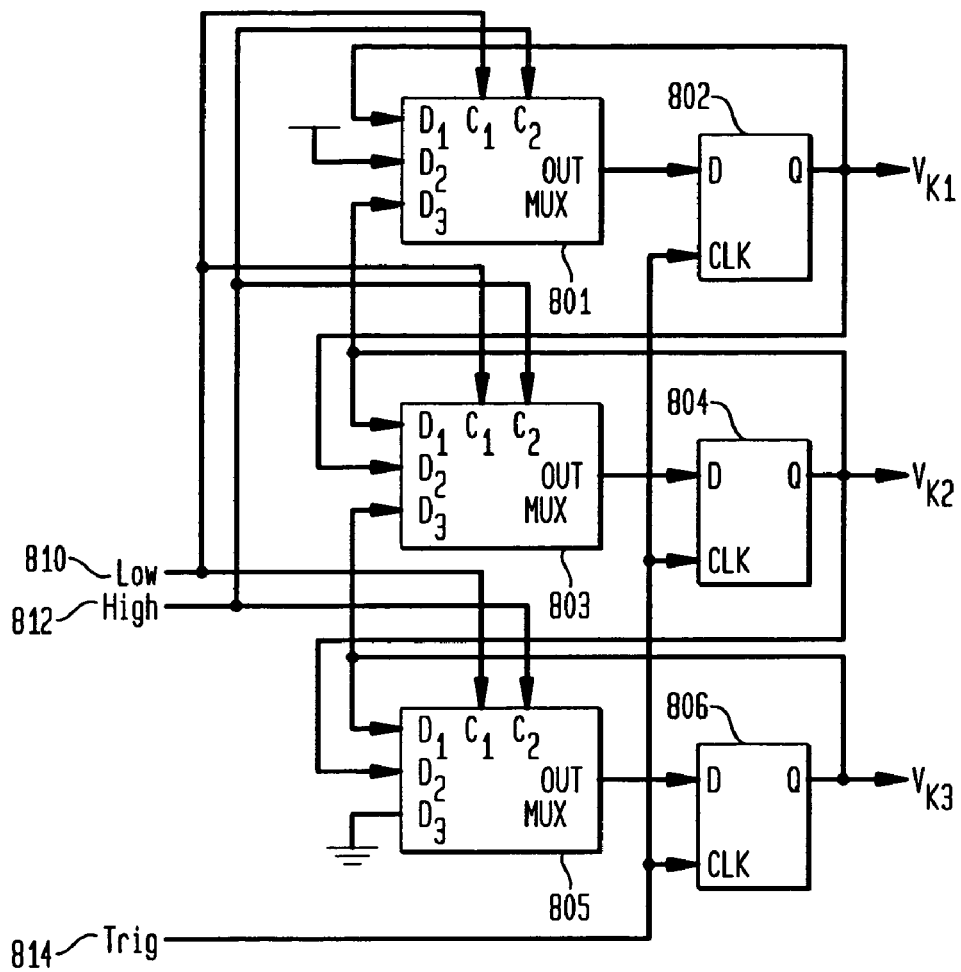
FIG. 8A is a circuit diagram of the selection circuit of a phase-locked loop with automatic voltage controlled oscillator band selection in accordance with the present invention.

A schematic circuit diagram of an exemplary implementation of the selection circuit (412 in FIG. 4) is shown in FIG. 8A. The selection circuit controls the switches in the multi-band VCO that provide the band determining capacitance. The selection circuit functions in the same manner as a two-way shift register. A plurality of multiplexers are used to shift the register forward or backward, in response to a triggering signal provided by the decision circuit. The exemplary selection circuit shown in FIG. 8A provides switching between four bands for a four band multi-band VCO. It is understood, however, that the same design could be applied to any number of bands by increasing the number of multiplexers and flip-flops used.

The selection circuit comprises a series of multiplexers 801, 803, 805 and a series of flip-flops 802, 804, 806. The multiplexers 801, 803, 805 and flip-flops 802, 804, 806 are coupled together to form a two-way shift register. The low input 810 from the decision circuit and the high input 812 from the decision circuit are coupled to each multiplexer. The output of each multiplexer is coupled to the input of a D-type flip-flop that has its clock input coupled to the trigger input (Trig 814) from the decision circuit. This allows the selection circuit to trigger a change in the shift register status. The output of each flip-flop drives the switching capacitors in the multi-band VCO.

Figure 8B:
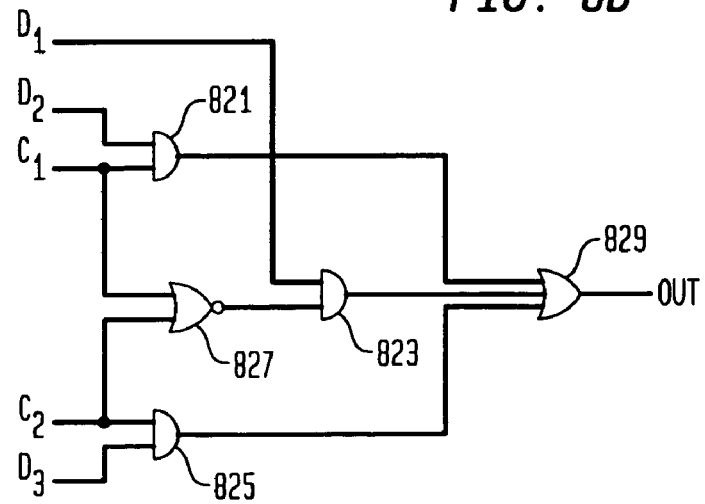
FIG. 8B is a logical diagram of the multiplexer of the circuit shown in FIG. 8A.

A logical diagram of the multiplexers is shown in FIG. 8b. The multiplexer has three inputs ($D_1$, $D_2$, $D_3$) in addition to the high and low inputs ($C_1$, $C_2$) from the decision circuit. A series of AND gates (821, 823, 825) are used to couple each D input with one of $C_1$, $C_2$, or the combination $C_1$, or $C_2$. Specifically, $D_2$ is ANDed with $C_1$, $D_3$ is ANDed with $C_2$, and $D_1$ is ANDed with the output of NOR gate 827 which has $C_1$, and $C_2$ as its inputs. The outputs of the AND gates (821, 823, 825) are input to OR gate 829, with the resulting output being the output of the multiplexer provided to a D-type flip-flop.

Figure 8C:
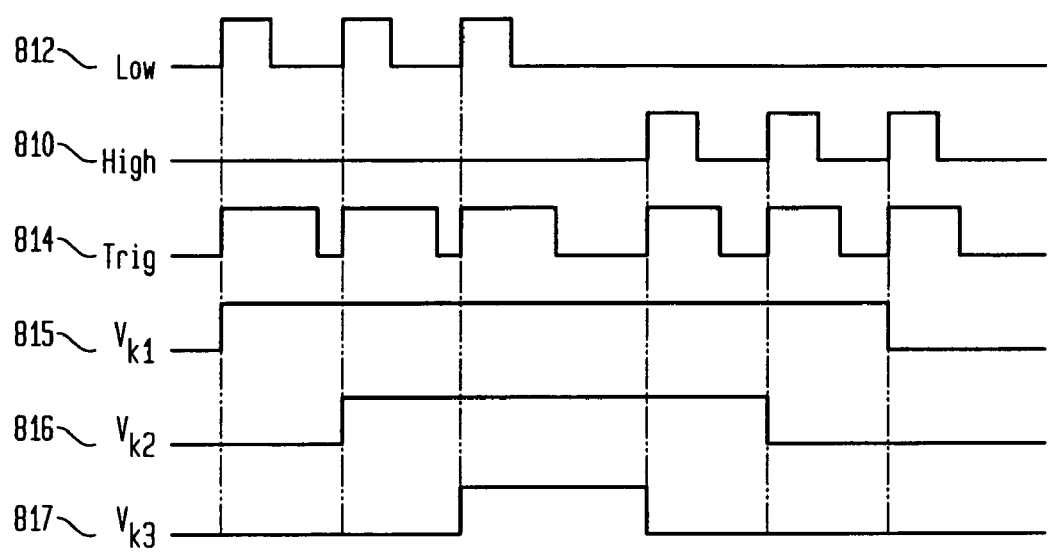
FIG. 8C is a graph of the waveforms of the circuit shown in FIG. 8A.

The waveforms of the selection circuit are shown in FIG. 8c. Each time the Trig waveform 814 goes high and the Low input waveform 812 goes high, an additional output waveform (from a plurality of output waveforms $V_{K1}$ 815, $V_{K2}$ 816, $V_{K3}$ 817) switches to high, causing additional switching capacitance to be added to the multi-band VCO (i.e., the multi-band VCO changes to a lower band). Upon a pulse on Trig waveform 814 with the High input waveform 810 high, an additional output switches to low causing additional switching capacitance to be removed in the multi-band VCO (i.e., the multi-band VCO changes to a higher band). In the exemplary embodiment, $V_{K1}$ 815, $V_{K2}$ 816, $V_{K3}$ 817 form a thermometer code for controlling the switching capacitors in the voltage controlled oscillator. If binary code is need, a simple combinational logic circuit can be used to convert thermometer code to binary code.

Using the band selection circuit in accordance with the present invention allows for automatic band selection in a phase locked loop comprising a multi-band voltage controlled oscillator without a pre-calculated settling period based on the loop dynamics. The circuit and method in accordance with the present invention resets the VCO input voltage upon band switching and is not dependent upon the dynamics of the remainder of the phase locked loop. This allows for a stable phase locked loop with a wide tuning range, while still maintaining low phase noise by maintaining non-steep tuning curves.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A phase-locked loop circuit comprising:
    a voltage controlled oscillator having a voltage input terminal for receiving an input voltage;
    a selection circuit coupled to said voltage controlled oscillator, wherein said selection circuit selects a band for said voltage controlled oscillator from a plurality of predetermined bands;
    a decision circuit coupled to said selection circuit, wherein said decision circuit determines if said selection circuit should select a new band from said plurality of predetermined bands; and
    a charging circuit coupled to said decision circuit and said voltage input terminal of said voltage controlled oscillator, wherein said charging circuit adjusts a voltage at said voltage input terminal of said voltage controlled oscillator responsive to a signal received from said decision circuit;
    wherein said charging circuit adjusts said voltage at said voltage input terminal to a voltage selected to minimize a settling delay of said circuit.

2. A circuit as set forth in claim 1, wherein said decision circuit comprises:
    a high trigger input, a low trigger input, a high reset input, and a low reset input;
    an UP output, a DOWN output, and a Trigger output;
    a plurality of flip-flops, said flip-flops configured to provide a high voltage level on said DOWN output responsive to a high voltage level received on said high trigger input and a high voltage level on said UP input responsive to a high voltage level received on said low trigger input.

3. A circuit as set forth in claim 2, wherein said flip-flops are D type flip-flops.

4. A circuit as set forth in claim 1, wherein said charging circuit comprises:
   at least one current source;
   at least one switch coupled between said current source and said input voltage.

5. A phase locked loop frequency synthesizer comprising a circuit as set forth in claim 1.

6. A phase-locked loop circuit comprising:
   a voltage controlled oscillator having a voltage input terminal for receiving an input voltage;
   a selection circuit coupled to said voltage controlled oscillator, wherein said selection circuit selects a band for said voltage controlled oscillator from a plurality of predetermined bands;
   a decision circuit coupled to said selection circuit, wherein said decision circuit determines if said selection circuit should select a new band from said plurality of predetermined bands; and
   a charging circuit coupled to said decision circuit and said voltage input terminal of said voltage controlled oscillator, wherein said charging circuit adjusts a voltage at said voltage input terminal of said voltage controlled oscillator responsive to a signal received from said decision circuit;
   wherein, when said decision circuit determines that said selection circuit should select a new band, it breaks the phase locked loop circuit.

7. A circuit as set forth in claim 6 wherein said decision circuit determines if said selection circuit should select a new band by comparing said input voltage to a first voltage, $V_H$, and second reference voltage, $V_L$, respectively, set to the high and low voltages for the presently selected band.

8. A circuit as set forth in claim 7 wherein the decision circuit controls the charging circuit to adjust said voltage at said voltage input terminal of said voltage controlled oscillator to a third reference voltage, $V_{H-\Delta 1}$, that is less than $V_H$ and greater than $V_L$ when said input voltage is greater than said first reference voltage and to a fourth reference voltage, $V_{L+\Delta 2}$, that is greater than $V_L$ and less than $V_{H-\Delta 1}$ when said input voltage is less than $V_L$.

9. A circuit as set forth in claim 8 wherein $V_{H-\Delta 1}$ and $V_{L+\Delta 2}$ are, respectively, the high and low optimal usable limits within the presently selected band.

10. A circuit as set forth in claim 9 wherein the decision circuit further disables the charging circuit and closes the phase locked loop after the charging circuit adjusts said voltage at said input voltage terminal.

11. A phase-locked loop circuit comprising:
    a voltage controlled oscillator having a voltage input terminal for receiving an input voltage;
    a selection circuit coupled to said voltage controlled oscillator, wherein said selection circuit selects a band for said voltage controlled oscillator from a plurality of predetermined bands;
    a decision circuit coupled to said selection circuit, wherein said decision circuit determines if said selection circuit should select a new band from said plurality of predetermined bands; and
    a charging circuit coupled to said decision circuit and said voltage input terminal of said voltage controlled oscillator, wherein said charging circuit adjusts a voltage at said voltage input terminal of said voltage controlled oscillator responsive to a signal received from said decision circuit;
    wherein said selection circuit comprises:
    a shift register having a plurality of outputs values, said shift register comprising: at least one multiplexer having a multiplexer output; and
    at least one flip-flop coupled to said multiplexer output;
    wherein said shift register provides an output from said plurality of outputs values responsive to a signal from said decision circuit and wherein each output corresponds to a particular band in said plurality of predetermined bands for said voltage controlled oscillator.

12. A method for automatic band selection in a phase locked loop comprising a multi-band voltage controlled oscillator having a plurality of bands, said method comprising the steps of:
    1) measuring an input voltage to the voltage controlled oscillator;
    2) determining if said input voltage is outside of predetermined voltage levels;
    3) selecting a different band from said plurality of bands; and
    4) resetting said input voltage.

13. The method as set forth in claim 12 wherein step (4) comprises resetting said input voltage to a voltage chosen to minimize a settling delay of said circuit.

14. The method as set forth in claim 12 wherein step (3) comprises:
    3.1) comparing said input voltage to four reference voltages: $V_H$, $V_{H-\Delta 1}$, $V_L$, and $V_{L+\Delta 2}$;
    3.2) disabling said phase locked loop if said input voltage is higher than $V_H$ or lower than $V_L$;
    3.3) changing to a higher band when the input voltage is higher than $V_H$; and
    3.4) changing to a lower band when the input voltage is lower than $V_L$.

15. The method as set forth in claim 14 wherein step (4) comprises:
    4.1) charging the input voltage to $V_{L+\Delta 2}$ when the input voltage is less than $V_{L+\Delta 2}$; and
    4.2) discharging the input voltage to $V_{H-\Delta 1}$ when the input voltage is greater than $V_{H-\Delta 1}$.

16. The method as set forth in claim 15 further comprising the step of:
    (5) re-enabling said phase locked loop.

17. The method as set forth in claim 16 wherein $V_H$ is the high voltage of the presently selected band, $V_L$ is the low voltage for the presently selected band, $V_{H-\Delta 1}$ is the high optimal usable limit within the presently selected band and $V_{L+\Delta 2}$ is the low optimal usable limit within the presently selected band.

18. The method as set forth in claim 12, wherein the step of determining if said input voltage is outside of predetermined voltage levels comprises:
    comparing said input voltage with a plurality of reference voltages.

19. The method as set forth in claim 12, wherein the step of resetting said input voltage comprises:
    charging said input voltage to a first predetermined level when said input voltage is less than said predetermined level; and
    discharging said input voltage to a second predetermined level when said input voltage is greater than said second predetermined level.

* * * * *